United States Patent
Middendorf et al.

(10) Patent No.: US 9,793,179 B2
(45) Date of Patent: Oct. 17, 2017

(54) METHOD FOR DETERMINING A BONDING CONNECTION IN A COMPONENT ARRANGEMENT AND TEST APPARATUS

(71) Applicants: FRAUNHOFER-GESELLSCHAFT ZUR FÖRDERUNG DER ANGEWANDTEN FORSCHUNG E.V., München (DE); TECHNISCHE UNIVERSITÄT BERLIN, Berlin (DE)

(72) Inventors: Andreas Middendorf, Kleinmachnow (DE); Torsten Nowak, Berlin (DE); Sergei Janzen, Berline (DE)

(73) Assignees: Technische Universitat Berlin, Berlin (DE); Fraunhofer-Gesellschaft Zur Forderung Der Angewandten Forschung E.V., Munich (DE)

( * ) Notice: Subject to any disclaimer, the term of this patent is extended or adjusted under 35 U.S.C. 154(b) by 0 days.

(21) Appl. No.: 15/125,035

(22) PCT Filed: Mar. 3, 2015

(86) PCT No.: PCT/DE2015/100082
§ 371 (c)(1),
(2) Date: Sep. 9, 2016

(87) PCT Pub. No.: WO2015/135529
PCT Pub. Date: Sep. 17, 2015

(65) Prior Publication Data
US 2017/0025316 A1    Jan. 26, 2017

(30) Foreign Application Priority Data

Mar. 10, 2014   (DE) .......................... 10 2014 103 180

(51) Int. Cl.
*H01L 21/00*   (2006.01)
*H01L 21/66*   (2006.01)
*H01L 23/00*   (2006.01)

(52) U.S. Cl.
CPC .............. *H01L 22/12* (2013.01); *H01L 24/48* (2013.01); *H01L 24/49* (2013.01); *H01L 24/85* (2013.01);
(Continued)

(58) Field of Classification Search
CPC ....................................................... H01L 22/12
See application file for complete search history.

(56) References Cited

U.S. PATENT DOCUMENTS

| 5,101,263 A * | 3/1992 | Kitano | H01L 24/85 |
| | | | 257/734 |
| 2013/0075371 A1* | 3/2013 | De Souza | G01N 25/72 |
| | | | 219/109 |

FOREIGN PATENT DOCUMENTS

| CN | 103579032 A | 2/2014 |
| DE | 102010038130 A1 | 4/2012 |

(Continued)

OTHER PUBLICATIONS

Shakouri, Ali, et al.: "Ultrafast submicron thermal characterization of integrated circuits", Physical and Failure Analysis of Integrated Circuits (IPFA), 2012, 19th IEEE International Symposium on the, IEEE, Jul. 2, 2012, (Jul. 2, 2012), pp. 1-2.

(Continued)

*Primary Examiner* — William Harriston
(74) *Attorney, Agent, or Firm* — Harness Dickey

(57) ABSTRACT

The application relates to a method for determining a bonding connection (1) in a component arrangement (2), wherein the method has the following steps: producing a bonding connection (1) between a bonding section (3) of a (Continued)

bonding wire (4) and a metallic contact point (5), structuring a top-side surface of the bonding wire (4) in the region of the bonding section (3) and determining the bonding connection (1), wherein in this case a test voltage is applied to the bonding wire (4) and the bonding connection (1) so that the bonding connection (1) heats up owing to the current flow, generating a thermogram for the heated bonding connection (1) and determining whether the bonding connection (1) has been produced correctly by evaluating the thermogram. Furthermore, the application relates to a test apparatus for determining a bonding connection (1) in a component arrangement (2).

14 Claims, 4 Drawing Sheets

(52) U.S. Cl.
CPC .......... *H01L 2224/4805* (2013.01); *H01L 2224/48227* (2013.01); *H01L 2224/49175* (2013.01); *H01L 2224/859* (2013.01); *H01L 2224/85939* (2013.01); *H01L 2224/85986* (2013.01); *H01L 2924/00014* (2013.01)

(56) References Cited

FOREIGN PATENT DOCUMENTS

| JP | S6073347 A | 4/1985 |
|---|---|---|
| JP | H0294454 A | 4/1990 |
| JP | H0774202 A | 3/1995 |
| WO | WO-2011156527 A1 | 12/2011 |

OTHER PUBLICATIONS

International Search Report (in English and German) and Written Opinion of the International Searching Authority (in German) issued in PCT/DE2015/100082, dated Jun. 30, 2015; ISA/EP.

\* cited by examiner

METHOD FOR DETERMINING A BONDING CONNECTION IN A COMPONENT ARRANGEMENT AND TEST APPARATUS

CROSS-REFERENCE TO RELATED APPLICATIONS

This application is a national phase of PCT/DE2015/100082, filed Mar. 3, 2015 which claims priority to German Serial No. 10 2014 103 180.6 filed Mar. 10, 2014. The entire disclosures of the above applications are incorporated herein by reference.

The present disclosure refers to a method for determining a bonding connection in a component arrangement and a test apparatus.

BACKGROUND

Bonding is used particularly to connect the outwardly visible terminals in an electronic circuit,—also referred to as pins—to chip connectors via bonding wires, thereby creating contact points. In this context, the bonding wire particularly assumes the function of the electrical connection between the integrated circuit and a substrate.

When manufacturing component arrangements of such kind, it is particularly important to pay attention to the correct formation of the bond connections, so that they guarantee the necessary current flow in operation. In this context, on the one hand attempts are made to produce bond connection with improved properties. For a thick wire bonding arrangement, it is suggested in document DE 10 2010 038 130 A1 to provide a tapered section at the end of the bonding wire in the region of the bonding section for which the bond connection is designed.

To ensure that the electrical contact is adequate in the context of bond connections, checks are made in spot-check manner with one or more bonding connections in production after the component arrangement is made to verify that they have been made correctly. For this, a "shear test" is employed, in which shearing forces are applied to the bonding connections on the test sample to verify its mechanical stability.

In document CN 103 579 032 A, it is suggested to inspect the aluminium bonding connection thermally with a thermosensor system after it is produced. The use of infrared imaging is provided, in order to determine temperature distribution.

Document WO 2011/156527 A1 discloses a method for non-destructive testing of electronic components. The object is to identify three-dimensional "hot spots" identified using Lock-in Thermography (LIT).

SUMMARY

It is an object to provide a method for determining a bonding connection in a component arrangement, particularly a thick-wire bonding connection, and a test apparatus with which the correct bonding connection is formed simply even in mass production of component arrangements and can be tested reliably.

A method is provided for determining a bonding connection in a component arrangement according to independent claim 1. A test apparatus for determining a bonding connection in a component arrangement according to independent claim 13 is also provided. Alternative embodiments are the object of the dependent claims.

According to one aspect, a method for determining or testing a bonding connection in a component arrangement is created, in which a bonding connection is created between a bonding section of a bonding wire and a metal contact point. It is provided to structure a top-side surface of the bonding wire in the region of the bonding section. This may be carried out before the wire is bonded and/or after the bonding connection has been created. It may be provided to furnished the bonding wire with markings in the region of the bonding section, which markings indicate the region for the surface structuring before and/or after the bonding. During structuring, the top-side surface of the bonding wire may be provided with a plurality of depressions, for example. The structuring of the top-side surface of the bonding wire is carried out in such manner as to preserve conductivity of the operating current. This means that the bonded wire is still able to deliver the electric or electronic function of the bonding connection intended for operating the component arrangement after the structuring. The bonding connection may then be tested in a non-destructive test method.

When determining or testing the bonding connection, a test voltage is applied to the bonding wire and the bonding connection in such manner that the bonding connection is heated by a current flow induced thereby. The result of this is heat radiation. The heated bonding connection is captured in a thermogram. The thermogram is evaluated to determine whether the bonding connection was produced correctly, that is to say particularly that it is able to guarantee the current flow necessary for operation as required by its function.

The structuring created selectively in the region of the top-side surface of the bonding wire in the region of the bonding section is different from and additional to a surface deviation (contouring) that may possibly occur randomly or as a result of the manufacturing process, and which may be caused by the use of bonding tools, a sonotrode for example, during the actual bonding operation.

The structuring of the top-side surface applied in the region of the bonding section supports good visibility of the region with the bonding connection in the thermogram, thus enabling the desired evaluation to be made subsequently. Thermography is an imaging process for displaying the surface temperature of the object under consideration. In contrast to any change in the surface that occurs randomly, which may particularly be the result of the use of the bonding tool, the deliberately created, and to this extent artificially produced surface structuring is associated with an infrared radiation characteristic of the respective structuring, and this is detected in the thermogram. In order to make the recording, thermal imaging cameras are used, for example.

The thermogram may comprise one or more thermograms. Alternatively or additionally, it may be provided to use video film recordings.

When the test method for determining the bonding connection is integrated in a production process for producing component arrangement, the method may be performed in random sampling manner simultaneously with the production process, wherein all bonding connections of the component arrangement being tested can be inspected. If it is found that the bonding connection being tested has been produced correctly, the component arrangement under inspection can be returned to the production process or, if the process for the component arrangement under inspection has already ended, it may be returned as a component arrangement suitable for further use.

According to a further aspect, a test apparatus for determining or testing a bonding connection in a component arrangement is created, which apparatus is particularly able to implement the method described previously. The test apparatus has a structuring device which is configured to structure a top-side surface of a bonding wire in the region of a bonding section, for which a bonding connection with a metal contact point is produced before or after the structuring. The bonding connection is determined with a test device, wherein the test device is designed to apply a test voltage to the bonding wire and the bonding connection from a voltage source so that the bonding connection is heated by the current flow. The test device further includes a thermographic recording device, for example a thermal imaging camera, with which a thermogram of the heated bonding connection can be captured. In order to evaluate the thermogram, an evaluation device is provided with which it is possible to determine whether the bonding connection was produced correctly by analysing the thermogram. A part of the evaluation device may particularly be a data processing device, a computer for example, with which the thermogram can be processed in digital form to determine whether the bonding connection shown in the thermogram has been produced correctly and is capable of proper functioning. The evaluation device may also include a display arrangement for displaying the thermogram.

Since the application of the test voltage results in hot spots occurring only in or on the bonding connections, a thermogram has greater local resolution and is more precise for purposes of temperature determination.

When the test voltage is applied, at least an average operating voltage may be reached for the bonding connection when the component arrangement is in use. The applied operating voltage may reach the value of a highest permissible operating voltage for the component arrangement and may optionally exceed it within a reliable (non-destructive) permitted limit. In this or other embodiments, test voltage pulses may be applied at a test repeating frequency so that the bonding connection is heated multiple times. Triggered by the frequency with which the test pulses are applied, multiple thermograms can be created and included in the examination to determine whether the bonding connection has bee created in good order.

It may be provided that during the determination, the thermogram is compared with one or more reference thermograms. The reference thermograms or recordings may show correctly formed and/or incorrectly formed bonding connections for comparison purposes, enabling a conclusion to be made regarding the nature of the inspected bonding connection based on the comparison. The comparison may be performed by means of digital image processing. In this case, it may be provided for the purpose of the image analysis to initially select one or more bonding connections on the basis of the surface structuring, and then to carry out further image analysis for only these image areas on the basis of the temperature information. An advantage of using digital image processing is that it then becomes possible to store the image data in a database, and carry out testing cyclically to determine when any degradation is taking place. It may be provided that multiple bonding connections are tested for the component arrangement, and the component arrangement is rejected as scrap if at least one of the bonding connections tested is determined not have been formed correctly.

During the determination, the at least one thermogram may be evaluated by digital image analysis. In the case of digital image analysis it may be provided that these may be used to search in the thermogram for characteristic image patterns that match the structuring of the top-side surface of the bonding wire, so that the characteristic image patterns may be evaluated to determine the correctness of the bonding connection. In this context, it may be provided to determine a time resolved heating behaviour and/or a heating end temperature particularly for the area of the characteristic image patterns and/or adjacent thereto. These and other parameters that can be determined from the image analysis can be compared with stored reference parameters that characterise correctly and/or incorrectly produced bonding connections, and thus finally determine a test result for the bonding connection being examined.

The thermogram can be used to capture a response over time when the bonding connection is heated and for evaluation when in the determination. At the same time, it may be possible to examine the way the heating of the bonding connection progresses over time due to the application of a test voltage. For this purpose, it may be provided to capture multiple thermograms at regular time intervals, triggered for example according to the repeat frequency of the test voltage pulses. Alternatively or in addition thereto, a video film may be recorded as part of the thermographic imaging. The response to heating over time is different for correctly and incorrectly produced bonding connections, so that it is possible to draw conclusions regarding the quality of the bonding connections from the evaluation of the response over time.

A final temperature may be set for the heating when the determination of the bonding connection is made. As this is already known as such for thermograms, a final temperature assigned to the surfaces under examination may be determined by image analysis. In this case also, correctly produced bonding connections and bonding connections that do not satisfy requirements regularly exhibit differences in terms of final temperature.

The application of the test voltage and generation of the thermogram may be carried out repeatedly. The test voltage may be applied multiple times before the correctness of the bonding site is finally established by means of image analysis. If multiple thermograms are created, this may be preceded by an averaging process, to improve the signal-to-noise ratio, for example. The test voltage may be applied repeatedly at a frequency between 1 Hz and about 10 Hz, for example.

When the bonding connection is heated, a rise in temperature from about room temperature to at least about 100° C. may be induced by the application of the test voltage. In one variant, it may be provided to induce a rise in temperature up to at least about 150°.

The surface structuring may be designed in any way, for example with parallel structures such as depressions that may be aligned at an angle or perpendicularly to the lengthwise direction of the bonding wire. For mechanical working, a stamp may be provided, with which the to top-side surface structuring may be created in the bonding section.

It may be provided that the determination or test as to whether the bonding connection has been produced correctly is carried out as an online diagnosis procedure. In the online diagnosis, reference thermograms may be supplied to the evaluation device in which the thermogram is evaluated by a remote server apparatus via an online connection in. Alternatively or in addition thereto, the thermogram may be transmitted from the location where the image is made to an evaluation device that is connected to it online, thus enabling the image analysis to be carried out at a location other than site where the image was captured.

At least sections of the bonding connection may be blackened before the determination. Blackening enables the region of the bonding connection and also the bonding wire to be captured. An areal blackening may be provided, which captures the region of multiple or all bonding connections and areas adjacent thereto on the component arrangement. If blackening is carried out before the surface structuring is applied, when the structuring is produced the blacking may be removed again from partial areas by laser processing for example, particularly in the structured regions.

It may be provided to derive temperature information from the thermogram not only for the bonding connection, but for the bonded chip as well. This this, the chip temperature may thus be determined as well without the need to blacken the entire surface of the component arrangement under examination.

The variations of the method for determining the bonding connection described in the preceding text may be provided correspondingly in conjunction with the test apparatus for determining a bonding connection in a component arrangement.

DESCRIPTION OF THE EMBODIMENTS

In the following, embodiments will be explained in greater detail with reference to the figures. In the figures.

Figure 1:
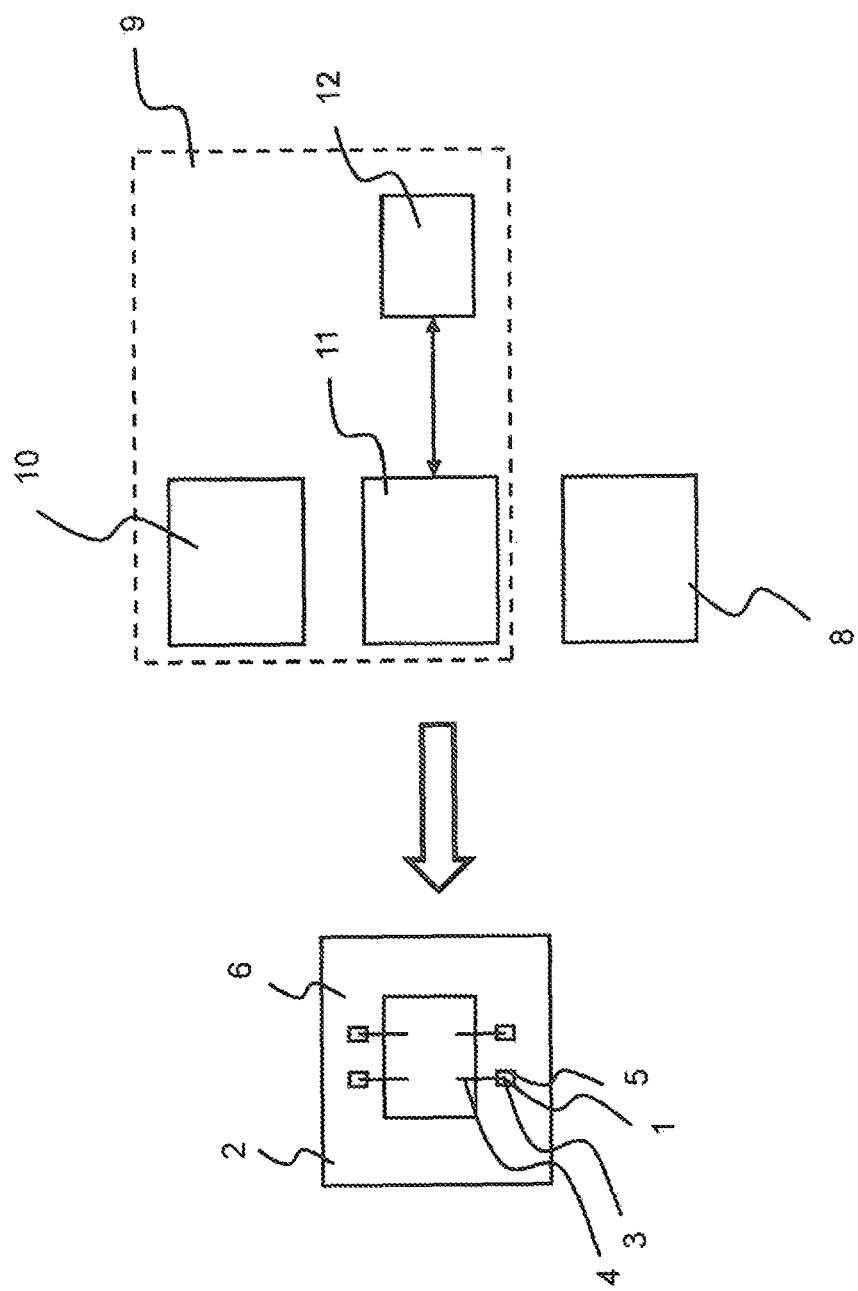
FIG. 1 is a schematic representation of a test apparatus for determining a bonding connection in a component arrangement.

FIG. 1 is a schematic representation of a test apparatus for optical determination of a bonding connection 1 in a component arrangement 2. A bonding section 3 of a bonding wire 4 is bonded in the region of bonding connection 1 to a metal contact point 5, which is formed on a component carrier 6 with a wiring structure. This serves to provide contacts between a chip 7 and component carrier 6.

The test apparatus includes a structuring device 8, which is designed to structure a top-side surface of bonding wire 4 in the region of bonding section 3. For this purpose structuring device 8 is equipped for example with a laser, by which the surface of bonding section 3 is processed to produce a structuring thereon, an example of which is shown in FIG. 2.

The test apparatus is also equipped with a test device 9, with which bonding connection 1 is tested to verify that it has been produced correctly. Test device 9 has a voltage source 10, which delivers a test voltage, for the purpose of applying the voltage to the bonding wire 4 for testing and to bonding connection 1, so that bonding connection 1 is heated by the current flow generated thereby. The infrared radiation that is generated by the heating may be captured with the aid of a thermographic recording device 11. The thermogram captured in this way is then analysed with an evaluation device 12 of test device 9 to test whether bonding connection 1 has been produced correctly.

Figure 2:
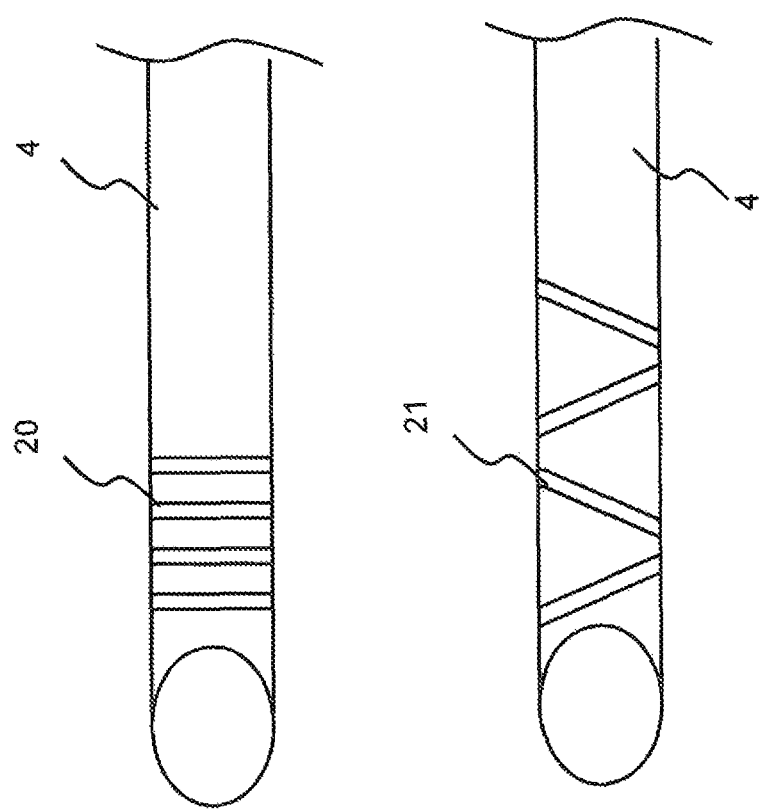
FIG. 2 is a schematic representation of bonding sections with a top-side surface structuring.
Figure 4:
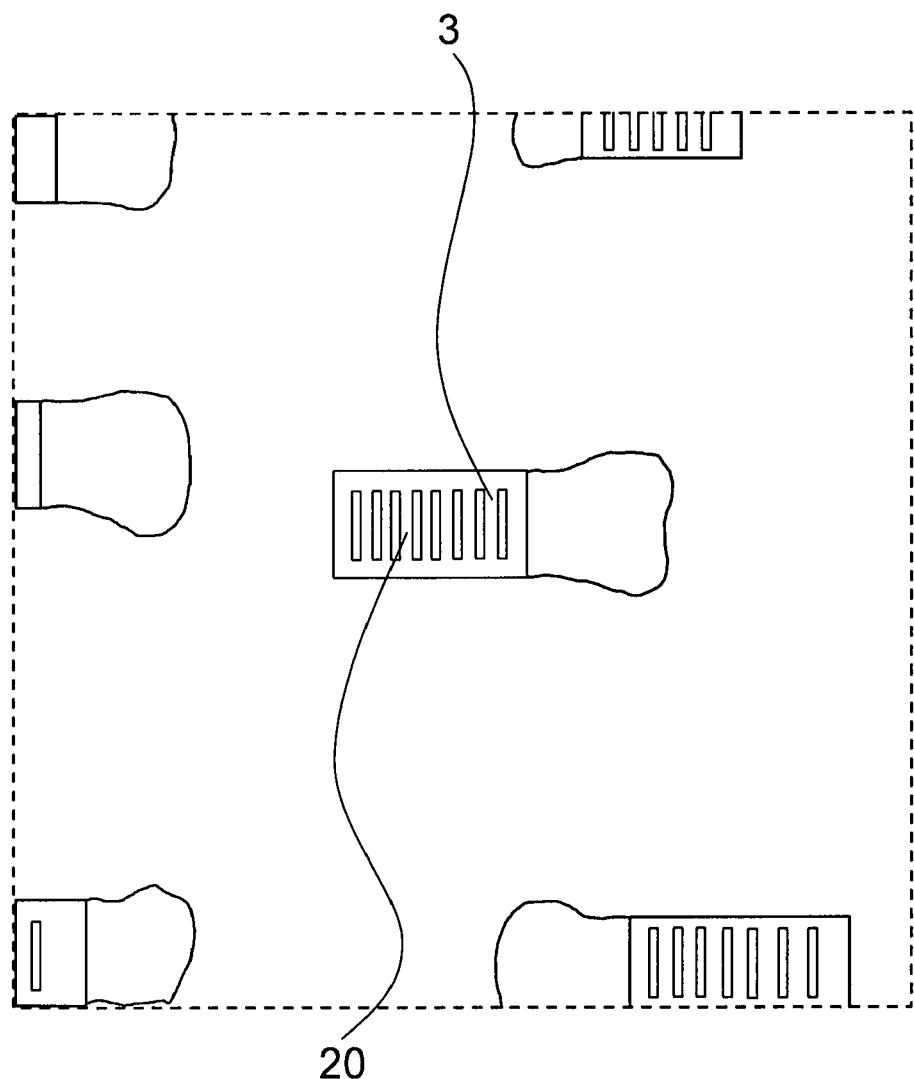
FIG. 4 is a thermogram of a bonding connection, in which the bonding section of the bonding wire is furnished with recesses conformed to extend transversely to the lengthwise axis of the bonding wire.

The surface structurings 20, 21 of bonding wire 4 in the region of bonding section 3 shown for exemplary purposes in FIG. 2 ensure that the bonding connection under examination can be identified reliably for test purposes in der thermogram. This shows an example of the thermogram in FIG. 4, in which bonding section 3 of the bonding connection under examination is provided with surface structuring 20.

Figure 3:
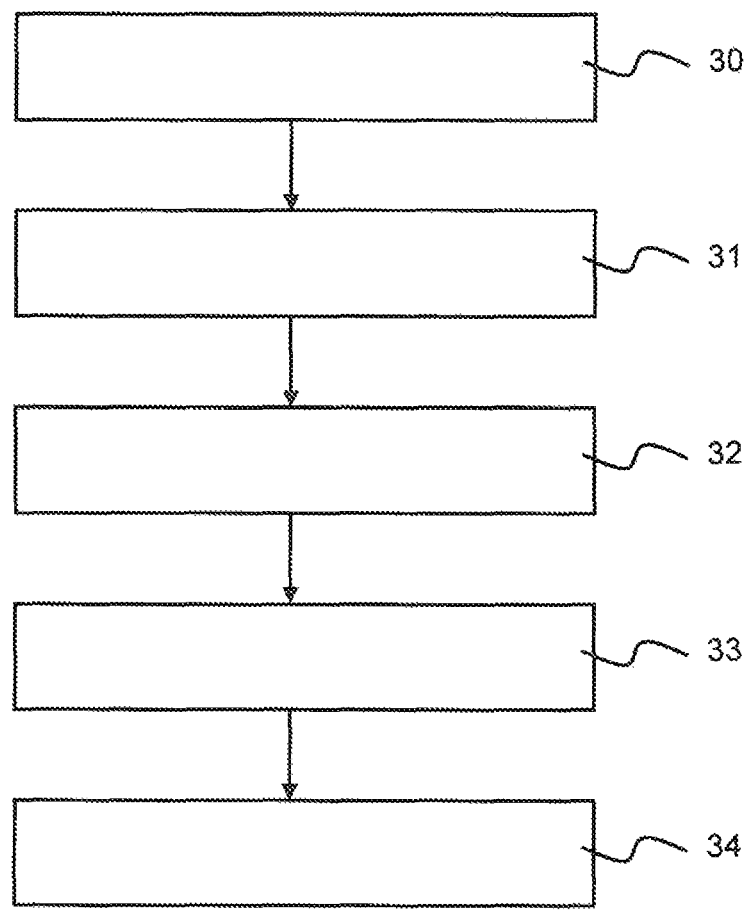
FIG. 3 is a schematic representation of a method sequence for determining a bonding connection in a component arrangement.

FIG. 3 is a schematic representation of the process sequence of an embodiment of a method for determining bonding connection 1 in the component arrangement. Bonding connection 1 is created between bonding section 3 of bonding wire 4 and metal contact point 5 in a step 30. IN the embodiment shown, the structuring of the top-side surface of bonding wire 4 in the region of bonding sections 3 takes place in step 31, by laser processing, for example. In an alternative embodiment, the surface structuring may also be produced before bonding connection 1 is created. Then, bonding connection 1 is determined, in which case a test voltage is applied to bonding wire 4 and bonding connection 1 in step 32, so that bonding connection 1 is heated up. According to step 33, a thermogram of the heated bonding connection is generated, for example with the aid of a thermal imaging camera. The thermogram may comprise one or more thermographic captures and/or thermographic video film recordings. Finally, in step 34, in which the thermogram is evaluated, a determination is made with the aid of evaluation device 12 as to whether bonding connection 1 was produced correctly. This evaluation may be carried out for one or more bonding connections. Finally, a decision may be made with as to whether the component arrangement ha s been produced correctly or incorrectly in terms of its bonding connections.

Features disclosed in the preceding description, the claims and in the drawing my be significant either alone or in any combination for the realisation of different variations of the invention.

The invention claimed is:

1. A Method for determining a bonding connection in a component arrangement, wherein the method comprises the following steps:
   producing a bonding connection between a bonding section of a bonding wire and a metal contact point, where the bonding connection is made on a circumferential surface of the bonding wire,
   structuring an exposed area of the circumferential surface of the bonding wire, where the exposed area is on an opposing side of the bonding wire from the bonding connection on the bonding section of the bonding wire, and
   determining the bonding connection, wherein in this
   a test voltage is applied to the bonding wire and the bonding connection, so that the bonding connection heats up owing to the current flow,
   generating a thermogram for the heated bonding connection and
   determining whether the bonding connection has been produced correctly by evaluating the thermogram.

2. The method according to claim 1, wherein when the test voltage is applied, at least one average operating voltage is reached for the bonding connection when the component arrangement is used.

3. The method according to claim 1, wherein during the determination the thermogram is compared with one or more reference thermograms.

4. The method according to claim 1, wherein during the determination the thermogram is evaluated via digital image evaluation.

5. The method according to claim 1, wherein the thermogram captures a response over time as the bonding connection is heated, and it evaluated in the determination.

6. The method according to claim 1, wherein during the determination final temperature is fixed for the heating of bonding connection.

7. The method according to claim 1, wherein the application of the test voltage and the generation of the thermogram are carried out repeatedly.

8. The method according to claim 1, wherein when the bonding connection is heated owing to the applied test voltage a rise in temperature from about room temperature to at least about 100° C. id produced.

9. The method according to claim 1, wherein the structuring of the top-side surface of the bonding wire is carried out in the region of the bonding section by laser processing.

10. The method according to claim 1, wherein the one further bonding connection of bonding connection is determined similarly.

11. The method according to claim 1, wherein the determination as to whether the bonding connection was produced correctly is carried out as an online diagnosis.

12. The method according to claim 1, wherein at least sections of the bonding connection are blackened before the determination.

13. The test device for a bonding connection in a component arrangement, according to claim 1, comprising:
a structuring device that is designed to structure a top-side surface of a bonding wire in the region of a bonding section, for which a bonding connection with a metal contact point is produced before or after the structuring, and
a test device for determining the bonding connection, wherein the test device is designed with
a voltage source to apply a test voltage to the bonding wire and the bonding connection, so that the bonding connection is heated owing to the current flow,
a thermographic recording device to generate a thermogram for the heated bonding connection, and
an evaluation device to determine whether the bonding connection was produced correctly in that the thermogram is analysed.

14. The method according to claim 2, wherein during the determination the thermogram is compared with one or more reference thermograms.

\* \* \* \* \*